United States Patent
Hsieh et al.

(10) Patent No.: US 11,678,460 B2
(45) Date of Patent: Jun. 13, 2023

(54) FAN MOUNTING CHASSIS

(71) Applicant: DELL PRODUCTS L.P., Round Rock, TX (US)

(72) Inventors: Nelson Hsieh, Taoyuan (TW); Chuan Chieh Tseng, Taipei (TW)

(73) Assignee: DELL PRODUCTS L.P., Round Rock, TX (US)

( * ) Notice: Subject to any disclaimer, the term of this patent is extended or adjusted under 35 U.S.C. 154(b) by 337 days.

(21) Appl. No.: 16/379,944

(22) Filed: Apr. 10, 2019

(65) Prior Publication Data

US 2020/0329581 A1  Oct. 15, 2020

(51) Int. Cl.
| | |
|---|---|
| H05K 7/20 | (2006.01) |
| F04D 25/08 | (2006.01) |
| F04D 29/60 | (2006.01) |
| F04D 25/06 | (2006.01) |
| F04D 25/16 | (2006.01) |
| F04D 29/64 | (2006.01) |

(52) U.S. Cl.
CPC ..... *H05K 7/20172* (2013.01); *F04D 25/0693* (2013.01); *F04D 25/08* (2013.01); *F04D 25/166* (2013.01); *F04D 29/601* (2013.01); *F04D 29/646* (2013.01)

(58) Field of Classification Search
CPC ........ F04D 25/08; F04D 25/16; F04D 25/166; F04D 29/60; F04D 29/601; F04D 29/64; F04D 29/644; F04D 29/646; F04D 23/005; F04D 25/0693; H05K 7/20172; H05K 7/20554–7/20581; H05K 7/20718–7/20736; B23P 15/00
See application file for complete search history.

(56) References Cited

U.S. PATENT DOCUMENTS

| | | | |
|---|---|---|---|
| 4,517,880 A | 5/1985 | Buckner et al. | |
| 4,926,291 A | 5/1990 | Sarraf | |
| 5,055,000 A * | 10/1991 | Akhter | H02K 7/14 417/40 |
| 5,186,605 A | 2/1993 | Tracy | |
| 5,208,730 A | 5/1993 | Tracy | |
| 5,969,941 A | 10/1999 | Cho | |
| 6,244,953 B1 | 6/2001 | Dugan et al. | |
| 6,351,380 B1 | 2/2002 | Curlee et al. | |
| 6,690,576 B2 | 2/2004 | Elements et al. | |
| 7,593,226 B2 | 9/2009 | Yamanaka | |
| 7,623,344 B2 | 11/2009 | Beall et al. | |
| 7,940,525 B2 * | 5/2011 | Letourneau | H05K 7/20172 361/695 |
| 9,485,888 B2 * | 11/2016 | Bell | H05K 7/20172 |
| 10,240,615 B1 * | 3/2019 | Kho | F04D 29/703 |
| 2011/0188201 A1 * | 8/2011 | Lin | H05K 7/20 361/688 |
| 2013/0256500 A1 * | 10/2013 | Sun | H05K 7/20172 248/674 |
| 2017/0265334 A1 * | 9/2017 | Oliver | F04D 29/403 |
| 2019/0215990 A1 * | 7/2019 | Chen | H05K 7/20172 |

* cited by examiner

*Primary Examiner* — Bryan M Lettman
(74) *Attorney, Agent, or Firm* — Jackson Walker LLP; Christopher J. Rourk

(57) ABSTRACT

An assembly that includes a planar surface, a plurality of first features disposed on the planar surface and a plurality of second features disposed on the planar surface. Each second feature is associated with one of the first features and a fan module coupled to one of the first features and the associated second feature.

17 Claims, 2 Drawing Sheets

FAN MOUNTING CHASSIS

TECHNICAL FIELD

The present disclosure relates generally to electronic equipment housing structures, and more specifically to a fan mounting chassis for use in an electronic equipment housing structure.

BACKGROUND OF THE INVENTION

Electronic equipment housings are typically custom designed and are difficult to repair or retrofit. These electronic equipment housings are usually thrown away after being used if a component breaks and cannot be easily replaced.

SUMMARY OF THE INVENTION

An assembly is disclosed that includes a planar surface and a plurality of first features disposed on the planar surface, such as projections or knobs. A plurality of second features are also disposed on the planar surface, where each second feature is associated with one of the first features. A fan module is coupled to one of the first features and the associated second feature, such as with a clip or in other suitable manners.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF THE INVENTION

Figure 1:
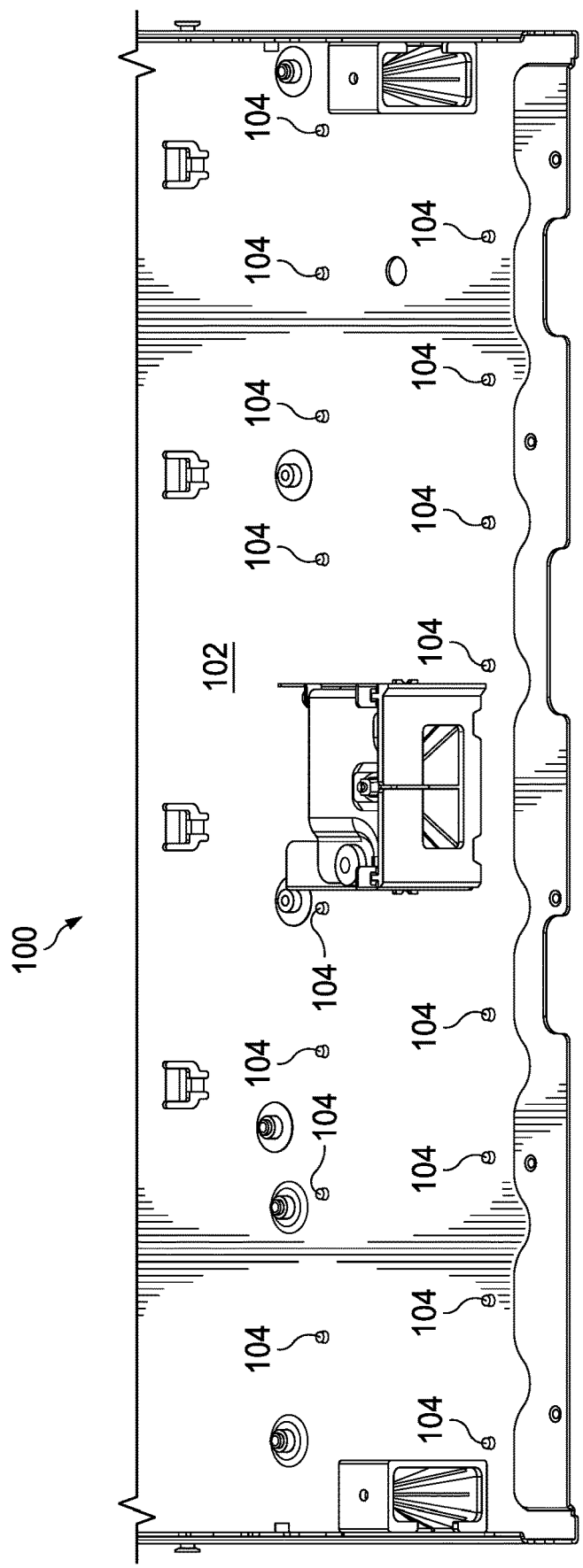
FIG. 1 is a diagram of an electronic component housing with a reconfigurable fan mounting chassis, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

Housing of electronic components is typically customized for a specific application. As a result, housing components that are capable of being reconfigured in the field for a specific modification are not well known. For example, it is not common for electronic component housing structures to be design to allow installation of additional fans or easy replacement of fans after completion of manufacturing. The present disclosure provides a system with reconfigurable components that are able to accommodate replacement of fan components after manufacturing, such as to allow fan modules to be removed or reinstalled in the field after a component is replaced or a new component is added.

In one example embodiment, the disclosed fan assembly does not require the use of any tools, and allows field personnel to simply remove a damaged fan assembly and replace it with a new fan assembly or module. The fan assembly can be snapped into place, secured with easily-accessible devices or modified in other suitable manners. The number of fan assemblies disposed in the component can be easily increased or decreased.

The present disclosure provides a number of advantages. One advantage is that no sheet metal or plastic parts are needed to deploy the fan modules. The elimination of these sheet metal and plastic parts results in easier assembly and lower cost.

Another advantage of the present disclosure is that it provides a fix point for the fan assembly that lies along a diagonal line within the chassis, as opposed to a fix point that is at opposite sides of each fan module. Providing the fix point along a diagonal line within the chassis provides the benefit of being able to increase the maximum number of fan assemblies that can be included in a given space. Increasing the number of fan assemblies allows more cooling air flow to be provided, and also provides additional space for routing cables, such as at the left and right ends of the fan assemblies, or in-between fan assemblies.

The present disclosure also eliminates the need for pins, screws, bolts or other additional components. Instead, the connecting features for the fan assemblies can be formed or extruded from the chassis, which simplifies assembly and reduces the costs associated with additional components and the associated assembly of those components.

FIG. 1 is a diagram 100 of an electronic component housing with a reconfigurable fan mounting chassis, in accordance with an example embodiment of the present disclosure. Base 102 includes a plurality of features 104, which can be formed or extruded from the same material as base 102. In one example embodiment, base 102 can be a molded plastic component, and features 104 can be included in the mold design. In another example embodiment, base 102 can be a sheet metal component, and features 104 can be formed by pressing, creasing or otherwise deforming the sheet metal. In another example embodiment, features 104 can be disposed along a diagonal line, to allow a fan assembly to be secured at two or more points while allowing features 104 to be placed closer together than if they were disposed along the same horizontal line relative to the front of the electronic component housing. In this manner, each fan assembly requires less space to secure it to base 102, which allows the fan assemblies to be placed closer together. Features 104 thus allow the fan assemblies to be disposed in a manner that provides additional space for cable penetrations on either side of the fan assemblies or in-between fan assemblies, as shown.

Figure 2:
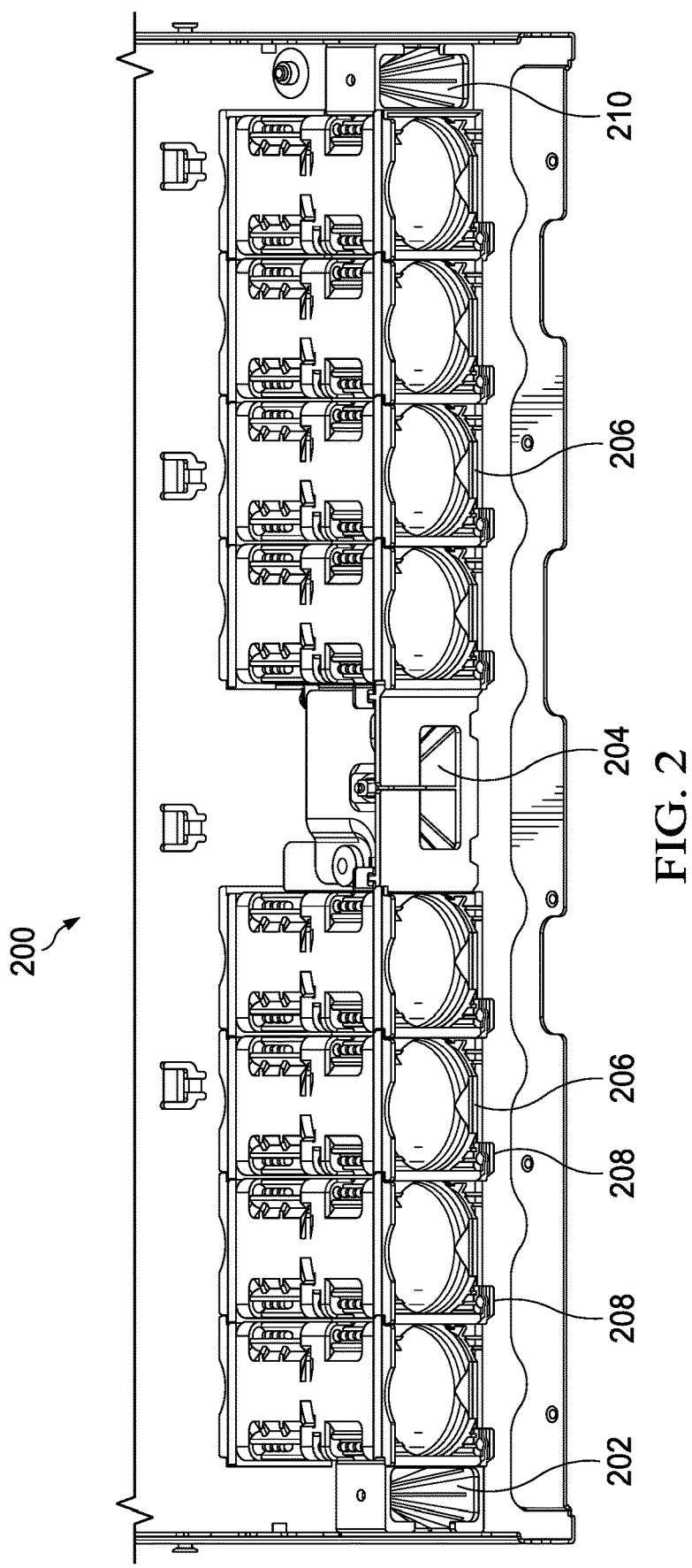
FIG. 2 is a diagram of an electronic component housing with mounted fan housings, in accordance with an example embodiment of the present disclosure.

FIG. 2 is a diagram 200 of an electronic component housing with mounted fan housings 206, in accordance with an example embodiment of the present disclosure. Mounted fan housings 206 are each disposed between a side cable channel 202 or 206 and a center cable channel 210, and each comprises four separate fan modules that each couple to features 104 (not explicitly shown). Each fan module includes a front clip 208 and a rear clip (not shown) that is diagonally disposed and which is used for connecting the fan module to diagonally disposed features 104 on base 102, which allows four fan modules to be provided as part of each mounted fan housing 206. With two mounted fan housings 206 as shown, this configuration provides a total of eight fan modules. This configuration allows mounted fan housing 206 to be removed and individual fan modules to be replaced, as needed.

In one example embodiment, an assembly is disclosed that includes a planar surface, a plurality of first features disposed on the planar surface, a plurality of second features disposed on the planar surface, each second feature associated with one of the first features and a fan module coupled to one of the first features and the associated second feature. The assembly can further include a second fan module coupled to a second one of the first features and a second one of the associated second features. The assembly can further include a second fan module disposed adjacent to the first fan module and coupled to a second one of the first features and a second one of the associated second features. The assembly can further include the plurality of first features and the plurality of second features disposed diagonally relative to each other and a front edge of the planar surface. The assembly can further include the planar surface, the plurality of first features and the plurality of second features formed from a single material. The assembly can further include the planar surface, the plurality of first features and the plurality of second features formed from a single material in a molding operation. The assembly can further include the planar surface, the plurality of first features and the plurality of second features formed from a single material in a metal forming operation. The assembly can further include a plurality of fan modules coupled together in a fan housing assembly. The assembly can further include a cable channel disposed adjacent to the fan module. The assembly can further include a plurality of fan modules coupled together in a fan housing assembly, a first cable channel disposed on a first side of the fan housing assembly and a second cable channel disposed on second side of the fan housing assembly. The assembly can further include a plurality of fan modules coupled together in a first fan housing assembly and a second fan housing assembly, a first cable channel disposed on a first side of the first fan housing assembly, a second cable channel disposed on second side of the first fan housing assembly and a third cable channel assembly disposed on a first side of the second fan housing assembly. The assembly can further include a plurality of fan modules coupled together in a first fan housing assembly and a second fan housing assembly, a first cable channel disposed on a first side of the first fan housing assembly, a second cable channel disposed on second side of the first fan housing assembly and a first side of the second fan housing assembly and a third cable channel assembly disposed on a second side of the second fan housing assembly.

In another example embodiment, an assembly is disclosed that includes a planar surface, a plurality of feature pairs disposed on the planar surface and a fan module coupled to one of the feature pairs. The assembly can further include a second fan module coupled to a second first pair. The assembly can further include a second fan module disposed adjacent to the first fan module and coupled to a second one of the feature pairs. Each the plurality of feature pairs of the assembly can further include a first feature and a second feature disposed diagonally relative to each other and a front edge of the planar surface. The assembly can further include the planar surface and the plurality of feature pairs formed from a single material. The assembly can further include the planar surface and the plurality of feature pairs formed from a single material in a molding operation. The assembly can further include the planar surface and the plurality of feature pairs formed from a single material in a metal forming operation.

In another example embodiment, an assembly includes a planar surface, a plurality of first features disposed on the planar surface, a plurality of second features disposed on the planar surface, each second feature associated with one of the first features, a fan module coupled to one of the first features and the associated second feature, a second fan module disposed adjacent to the first fan module and coupled to a second one of the first features and a second one of the associated second features, a plurality of fan modules coupled together in a first fan housing assembly and a second fan housing assembly, a first cable channel disposed on a first side of the first fan housing assembly, a second cable channel disposed on second side of the first fan housing assembly and a first side of the second fan housing assembly, and a third cable channel assembly disposed on a second side of the second fan housing assembly, wherein the plurality of first features and the plurality of second features are disposed diagonally relative to each other and a front edge of the planar surface, and wherein the planar surface, the plurality of first features and the plurality of second features are formed from a single material in a molding operation.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. A software system is typically created as an algorithmic source code by a human programmer, and the source code algorithm is then compiled into a machine language algorithm with the source code algorithm functions, and linked to the specific input/output devices, dynamic link libraries and other specific hardware and software components of a processor, which converts the processor from a general purpose processor into a specific purpose processor. This well-known process for implementing an algorithm using a processor should require no explanation for one of even rudimentary skill in the art. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. A system can receive one or more data inputs, such as data fields, user-entered data, control data in response to a user prompt or other suitable data, and can determine an action to take based on an algorithm, such as to proceed to a next algorithmic step if data is received, to repeat a prompt if data is not received, to perform a mathematical operation on two data fields, to sort or display data fields or to perform other suitable well-known algorithmic functions. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. An assembly comprising:
a planar surface;
a plurality of first features formed from the planar surface;
a plurality of second features formed from the planar surface, each second feature of the plurality of second features associated with one of the first features of the plurality of first features; and
a plurality of fan modules coupled together in a fan housing assembly, each of the fan modules coupled to one of the first features of the plurality of first features using a first clip disposed at an end of a front three-edge corner proximal to the planar surface and the associated second feature of the plurality of second features using a second clip diagonally disposed across the fan module from the first clip at a rear three-edge corner proximal to the planar surface, a first fan module of the plurality of fan modules having at least one unattached three-edge corner with an end distal to the planar surface shaped to couple with at an end distal to the planar surface of an attached front three-edge corner on an adjacent second fan module of the plurality of fan modules.

2. The assembly of claim 1 further comprising a second plurality of fan modules coupled together in a second fan housing assembly disposed adjacent to the first plurality of fan modules and configured to be field replaceable.

3. The assembly of claim 1 wherein the planar surface, the plurality of first features and the plurality of second features are formed from a single material.

4. The assembly of claim 1 wherein the planar surface, the plurality of first features and the plurality of second features are formed from a single material in a molding operation.

5. The assembly of claim 1 wherein the planar surface, the plurality of first features and the plurality of second features are formed from a single material in a metal forming operation.

6. The assembly of claim 1 further comprising a plurality of additional field replaceable fan modules coupled directly adjacent in a second fan housing assembly forming a single fan housing.

7. The assembly of claim 1 further comprising a cable channel disposed adjacent to a fan module of the plurality of fan modules at an unattached three-edge corner.

8. The assembly of claim 1 further comprising:
a first cable channel disposed on a first side of the plurality of fan modules; and
a second cable channel disposed on a second side of the plurality of fan modules.

9. The assembly of claim 1 further comprising:
a first cable channel disposed on a first side of the plurality of fan modules;
a second cable channel disposed on a second side of the plurality of fan modules; and a third cable channel disposed on a first side of a second plurality of fan modules coupled together in a second fan housing assembly.

10. The assembly of claim 1 further comprising:
a first cable channel disposed on a first side of the plurality of fan modules;
a second cable channel disposed on a second side of the plurality of fan modules and a first side of a second plurality of fan modules coupled together in a second fan housing assembly; and
a third cable channel disposed on a second side of the second plurality of fan modules.

11. An assembly comprising:
a planar surface formed from a material;
a plurality of feature pairs formed from the material of the planar surface; and
fan modules coupled together in a fan housing assembly, each of the fan modules coupled to one of the plurality of feature pairs using a first clip at an end of a front three-edge corner proximal to the planar surface and a second clip at an end of a rear three-edge corner proximal to the planar surface diagonally-disposed across the fan module from the first clip, each of the fan modules further comprising an unattached third three-edge corner disposed between the front three-edge corner and a rear three-edge-corner, wherein a first fan module of the fan modules has an unattached three-edge corner shaped to couple with an attached three-edge corner on an adjacent second fan module of the fan modules.

12. The assembly of claim 11 further comprising second fan modules coupled together in a second fan housing assembly, each of the second fan modules coupled to one of the plurality of feature pairs.

13. The assembly of claim 11 further comprising second fan modules coupled together in a second fan housing assembly and disposed adjacent to the first fan modules and each of the second fan modules coupled to one of the plurality of feature pairs.

14. The assembly of claim 11 wherein the planar surface and the plurality of feature pairs are formed from a molded material.

15. The assembly of claim 11 wherein the planar surface and the plurality of feature pairs are formed from a single material in a molding operation.

16. The assembly of claim 11 wherein the planar surface and the plurality of feature pairs are formed from a single material in a metal forming operation.

17. An assembly comprising:
a planar surface formed from a material;
a plurality of connectors formed from the material of the planar surface and extending from the planar surface; and
two or more adjacent fan modules coupled together in a fan housing assembly, each fan module coupled to a first of the plurality of connectors using a first clip at an end of a front three-edge corner proximal to the planar surface and to a second of the plurality of connectors using a second clip at an end of a rear corner proximal to the planar surface diagonally-disposed across the fan module from the front three-edge corner, a first fan module of the two or more adjacent fan modules having at least one unattached three-edge corner-shaped to couple with an attached front three-edge corner of a second fan module of the two or more adjacent fan modules.

* * * * *